United States Patent
Xie et al.

(10) Patent No.: US 10,908,206 B2
(45) Date of Patent: Feb. 2, 2021

(54) CHARACTERIZATION OF TRANSMISSION MEDIA

(71) Applicant: Intel Corporation, Santa Clara, CA (US)

(72) Inventors: Mayue Xie, Phoenix, AZ (US); Chengqing Hu, Chandler, AZ (US); Jong-Ru Guo, Portland, OR (US); Zuoguo Wu, San Jose, CA (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 16/302,555

(22) PCT Filed: May 17, 2016

(86) PCT No.: PCT/US2016/032820
§ 371 (c)(1),
(2) Date: Nov. 16, 2018

(87) PCT Pub. No.: WO2017/200531
PCT Pub. Date: Nov. 23, 2017

(65) Prior Publication Data
US 2019/0293708 A1     Sep. 26, 2019

(51) Int. Cl.
*G01R 31/28*     (2006.01)
*G01R 31/11*     (2006.01)
*H04B 10/071*     (2013.01)

(52) U.S. Cl.
CPC .......... *G01R 31/2837* (2013.01); *G01R 31/11* (2013.01); *G01R 31/2841* (2013.01); *H04B 10/071* (2013.01)

(58) Field of Classification Search
None
See application file for complete search history.

(56) References Cited

U.S. PATENT DOCUMENTS

| 4,688,464 A | 8/1987 | Gibson et al. |
|---|---|---|
| 5,497,111 A | 3/1996 | Cunningham |
| 6,679,119 B2 | 1/2004 | Board |
| 8,688,400 B2 | 4/2014 | Desai et al. |

(Continued)

OTHER PUBLICATIONS

International Search Report and Written Opinion issued in PCT Application No. PCT/US2016/032820 dated Feb. 10, 2017; 12 pages.

*Primary Examiner* — Jermele M Hollington
(74) *Attorney, Agent, or Firm* — Patent Capital Group

(57) ABSTRACT

Disclosed herein are systems and methods for the characterization of transmission media, among other embodiments. For example, a system for characterizing a transmission medium may include: a waveform generator to generate an initial input waveform; waveform pre-processing circuitry to process the initial waveform to generate a processed input waveform for provision to the transmission medium, wherein the processed input waveform has a maximum amplitude greater than a maximum amplitude of the initial input waveform; and waveform output circuitry to display or store data representative of an initial output waveform, wherein the initial output waveform is output from the transmission medium as a reflection or transmission of the processed input waveform.

25 Claims, 9 Drawing Sheets

(56) References Cited

U.S. PATENT DOCUMENTS

| | | | |
|---|---|---|---|
| 2007/0019282 A1* | 1/2007 | Weiner | G02F 2/002 |
| | | | 359/326 |
| 2008/0228426 A1* | 9/2008 | Calvin | G01R 31/31709 |
| | | | 702/124 |
| 2014/0102219 A1 | 4/2014 | Kuwahara et al. | |
| 2018/0052193 A1* | 2/2018 | Frampton | G01R 19/02 |

* cited by examiner

CHARACTERIZATION OF TRANSMISSION MEDIA

CROSS-REFERENCE TO RELATED APPLICATION

This application is a national stage application under 35 U.S.C. § 371 of PCT International Application Serial No. PCT/US2016/032820, filed on May 17, 2016 and entitled "CHARACTERIZATION OF TRANSMISSION MEDIA," which is hereby incorporated by reference herein in its entirety.

BACKGROUND

Time domain reflectometry (TDR) or time domain transmissometry (TDT) have been used to identify faults in electronic devices by looking for discrepancies between a reflected (or transmitted) signal in a device under test with an analogous signal in a "known good" device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
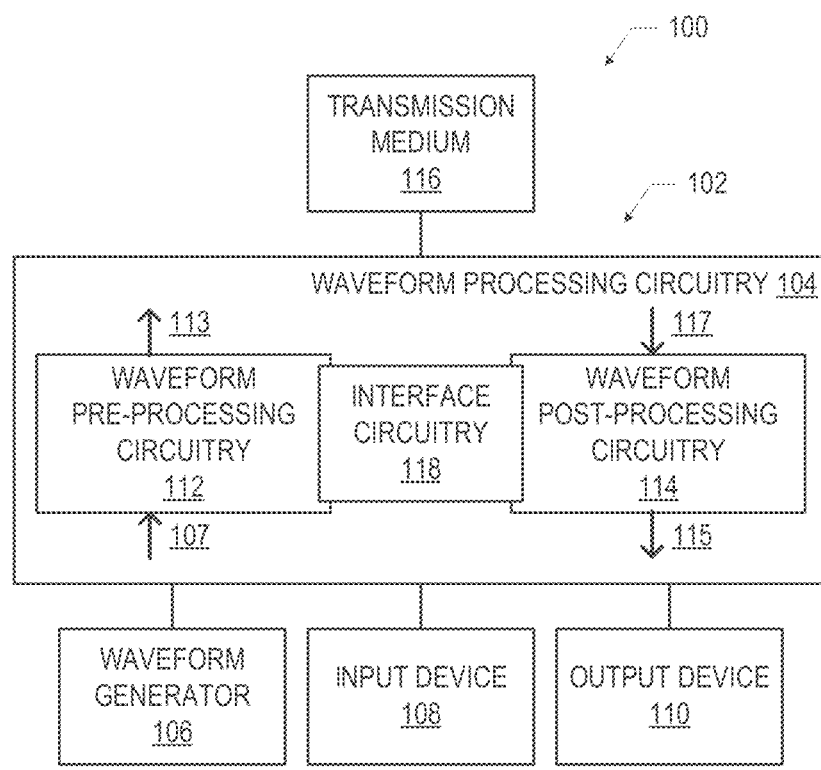
FIG. 1 is a block diagram of a transmission medium characterization arrangement including a transmission medium characterization system, in accordance with various embodiments.

Disclosed herein are systems and methods for the characterization of transmission media, among other embodiments. For example, a system for characterizing a transmission medium may include: a waveform generator to generate an initial input waveform; waveform pre-processing circuitry to process the initial waveform to generate a processed input waveform for provision to the transmission medium, wherein the processed input waveform has a maximum amplitude greater than a maximum amplitude of the initial input waveform; and waveform output circuitry to display or store data representative of an initial output waveform, wherein the initial output waveform is output from the transmission medium as a reflection or transmission of the processed input waveform.

Various embodiments disclosed herein may provide a fully integrated reflectometry/transmissometry system for device characterization and fault isolation (e.g., electrical fault isolation). The systems and methods disclosed herein may enable the detection of faults (such as electrical opens or shorts), impedance characterization, or the capture of other diagnostic and characterization information about a transmission medium.

Contemporary packaging technologies may allow a designer to create a full system-in-package (SiP) by integrating dies and packages horizontally and/or vertically. These dies and packages may include processing devices (e.g., a central processing unit (CPU)), memory (e.g., dynamic random access memory (DRAM)), analog circuitry, radio frequency (RF) devices, or other devices. Examples of such packaging technologies include package-on-package (PoP) structures with silicon interposers, embedded multichip interconnect bridges (EMIB), and through silicon vias (TSVs), among others. A silicon interposer in a PoP structure may include micro bumps on one face to couple to dies (e.g., field programmable gate array (FPGA) slices), controlled collapse chip connection (C4) bumps on the opposite face to couple to a package substrate, and TSVs between the faces to bridge different ones of the micro-bumps and to bridge micro-bumps to the C4 bumps. EMIBs are small silicon bridges embedded under only the edges of two adjacent die to interconnect those die; multiple EMIBs may be embedded in a package substrate, which may include further routing structures for power and ground. PoP structures with silicon interposers, and EMIB structures, may enable high-density design for high bandwidth communication. TSVs may be used in a silicon die to enable both faces of a silicon die to be attached to another component, and one or both of the faces may include a redistribution layer (RDL) to reroute the contact points for the conductive traces in the die.

However, as increasing numbers of components are included in integrated circuit (IC) packages (e.g., through 2.5-dimensional and 3-dimensional packaging technologies), the complexity of these packages increases. One consequence of these packaging technologies is that the resulting packages often include long and lossy interconnects through which signals are transmitted. This creates a problem during fault testing, which has conventionally involved providing a high-bandwidth test signal to an interconnect or other transmission medium and examining the resulting reflected signal (e.g., in time domain reflectometry, such as electro optical terahertz pulse reflectometry (EOTPR)) or the resulting transmitted signal (e.g., in time domain transmissometry) for peaks, valleys, and other features indicative of the presence of faults, for example, a reflected or transmitted signal for a device under test (DUT) may be compared to a reference reflected or transmitted signal for a "known good" device; deviations between the signals may indicate the presence of faults.

When conventional signals are provided to the long and lossy interconnects common to new package technologies, the signals attenuate too quickly in the interconnect to provide useful diagnostic information. For all of these package technologies, the design options for reducing the lengths of the interconnects are minimal due to pin budget constraints (e.g., the need for as few pins as possible to be used, even if that means long interconnects to bridge the pins) and coverage requirements.

Consequently, there is no reliable way to identify or locate failures in such interconnects, and thus performance and reliability cannot be guaranteed, in particular, in silicon interposers and EMIB structures, the metal traces inside the silicon may be very lossy for the high-frequency signals of interest, and conventional approaches to fault isolation aren't able to detect the defect location for long or chained silicon bridge metal lines. Similarly, TSVs and RDL traces are often very lossy due to their high density, and are similarly resistant to conventional fault isolation techniques. This is particularly true when TSVs and RDLs are coupled together to form TSV daisy chains, or logic-memory-interconnect (LMI) daisy chains.

The systems and methods disclosed herein may significantly improve on conventional transmission medium characterization systems by allowing defects in long and lossy interconnects or other transmission media to be identified with a desirable resolution and accuracy, thereby improving process and product yield. For example, while conventional transmission medium characterization systems may be able to isolate failures along an interconnect having a maximum distance of 8 to 10 millimeters, various ones of the embodiments disclosed herein may increase this range (e.g., by a factor of two or greater), in some embodiments, faults may be isolated along such long and lossy interconnects to a resolution of 30 microns or less. Significant increases in signal strength, resolution, and accuracy may be achieved by implementing one or more of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, the term "circuitry" may refer to, be part of, or include an application-specific integrated circuit (ASIC), an electronic circuit, and optical circuit, a processor (shared, dedicated, or group), and/or memory (shared, dedicated, or group) that execute one or more software or firmware programs, a combinational logic circuit, and/or other suitable hardware that provide the described functionality. The accompanying drawings are not necessarily drawn to scale.

FIG. 1 is a block diagram of a transmission medium characterization arrangement 100 including a transmission medium characterization system 102, in accordance with various embodiments. A transmission medium 116 that is to be tested by the system 102 may be coupled to interface circuitry 118 of waveform processing circuitry 104. Waveforms may be transmitted to and/or from the transmission medium 116 via the interface circuitry 118. Examples of the interface circuitry 118 are discussed below with reference to FIG. 2, and the interface circuitry 118 may be considered part of the waveform pre-processing circuitry 112, the waveform post-processing circuitry 114, or both. The transmission medium 116 may be any suitable structure, such as a conductive trace of a silicon interposer, a silicon bridge (e.g., an EMIB), a TSV, a conductive trace in a circuit board, a conductive trace in an IC package, a conductive trace in silicon, solder bumps or balls, copper pillars, any suitable portion of a device under test (DUT), or any combination of such structures. These structures are simply examples of a transmission medium 116, and the system 102 may be used with any suitable transmission medium 116.

A waveform generator 106 may generate an initial input waveform 107 that may be processed by the waveform pre-processing circuitry 112 to generate a processed input waveform 113, and the processed input waveform 113 may be provided to the transmission medium 116 via the interface circuitry 118. An initial output waveform 117, which may be output by the transmission medium 116 as a reflection or transmission of the processed input waveform 113, may be received via the interface circuitry 118 and processed by the waveform post-processing circuitry 114 to generate a processed output waveform 115. The processed output waveform 115 may be provided to an output device 110 (e.g., for storage, display, wireless or wired transmission to another device, etc.). An input device 108 may allow a user (e.g., a test engineer) or another computing device (e.g., a high-volume test machine) to control the operational parameters of the system 102, as discussed below. When the initial output waveform 117 is a reflection of the processed input waveform 113 in the transmission medium 116, the system 102 may be a time domain reflectometry (TDR) system; when the initial output waveform 117 is a transmission of the processed input waveform 113 in the transmission medium 116, the system 102 may be a time domain transmissometry (TDT) system.

The waveform pre-processing circuitry 112 and/or the waveform post-processing circuitry 114 may include analog components, digital components, or both analog and digital components. Although various embodiments of the waveform pre-processing circuitry 112 and the waveform post-processing circuitry 114 may be discussed herein with reference to analog or digital operations, the digital embodiments may be readily extended to their analog counterparts, and vice versa.

In some embodiments of the system 102, the waveform pre-processing circuitry 112 may not be included. In such embodiments, the initial input waveform 107 generated by the waveform generator 106 may be provided to the transmission medium 116 (via the interface circuitry) without undergoing the processing described herein with respect to various embodiments; of the waveform pre-processing circuitry 112. The initial input waveform 107 may undergo some processing by the interface circuitry 118 (e.g., interpolation or digital to analog conversion, in some embodiments), as discussed below. In some embodiments of the system 102, the waveform post-processing circuitry 114 may not be included. In such embodiments, the initial output waveform 117 may be provided to the output device 110 without undergoing the processing described herein with respect to various embodiments of the waveform post processing circuitry 114. The initial output waveform 117 may still undergo some processing by the interface circuitry 118 (e.g., sampling or analog-to-digital conversion, in some embodiments), as discussed below.

Figure 2:
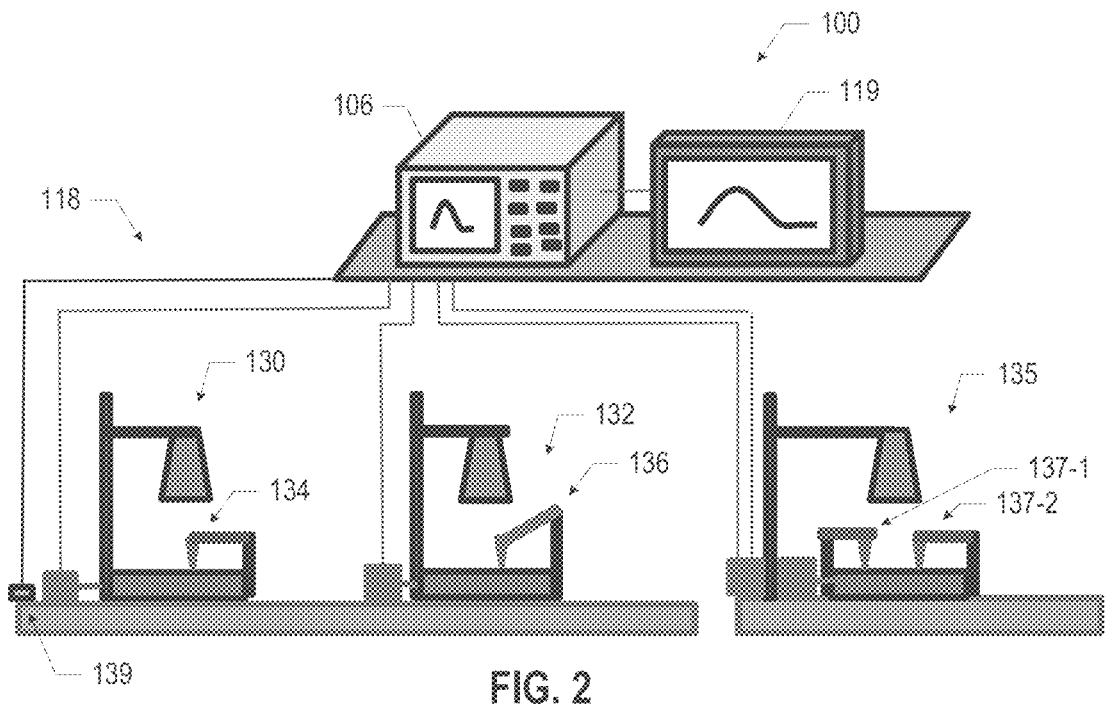
FIG. 2 is a diagram of an example of interface circuitry that may be included in a transmission medium characterization system, in accordance with various embodiments.

FIG. 2 is a block diagram of an example of interface circuitry 113 that may be included in the system 102, in accordance with various embodiments. The interface circuitry 118 may include a fine-pitch TDR probe station 130 including one or more probes 134 for making "automated" contact with desired locations on the transmission medium 116 (not shown). The interface circuitry 113 may include a manual probe TDR station 182, instead of or in addition to the fine-pitch TDR probe station 130, including one or more probes 136 for making "manual" contact with desired locations on the transmission medium 116 (not shown). The interface circuitry 118 may include a fine-pitch TDT probe station 135 including two or more probes 137 for making "automated" contact with desired locations on the transmission medium 116 (not shown). Two probes, 137-1 and 137-2, are illustrated in FIG. 2. An on/off switch 130 may control whether the processed input signal 117 reaches the transmission medium 116 in any of the probe stations 130, 132, and/or 135. The probes 134, 136, and/or 137, or the probe stations 130, 132, and/or 135, may include digital samplers to sample the initial output waveform 117; in some embodiments, the sampling frequency may be between 100 kHz and 100 MHz (e.g., 300 kHz). As shown in FIG. 2, the probe stations 130, 132, and/or 135 may be coupled to the waveform generator 106 and a computing device 119 that includes the waveform processing circuitry 104; the computing device 119 may also include the output device 110 (e.g., a display), and at least some of the input device 108.

Figure 13:
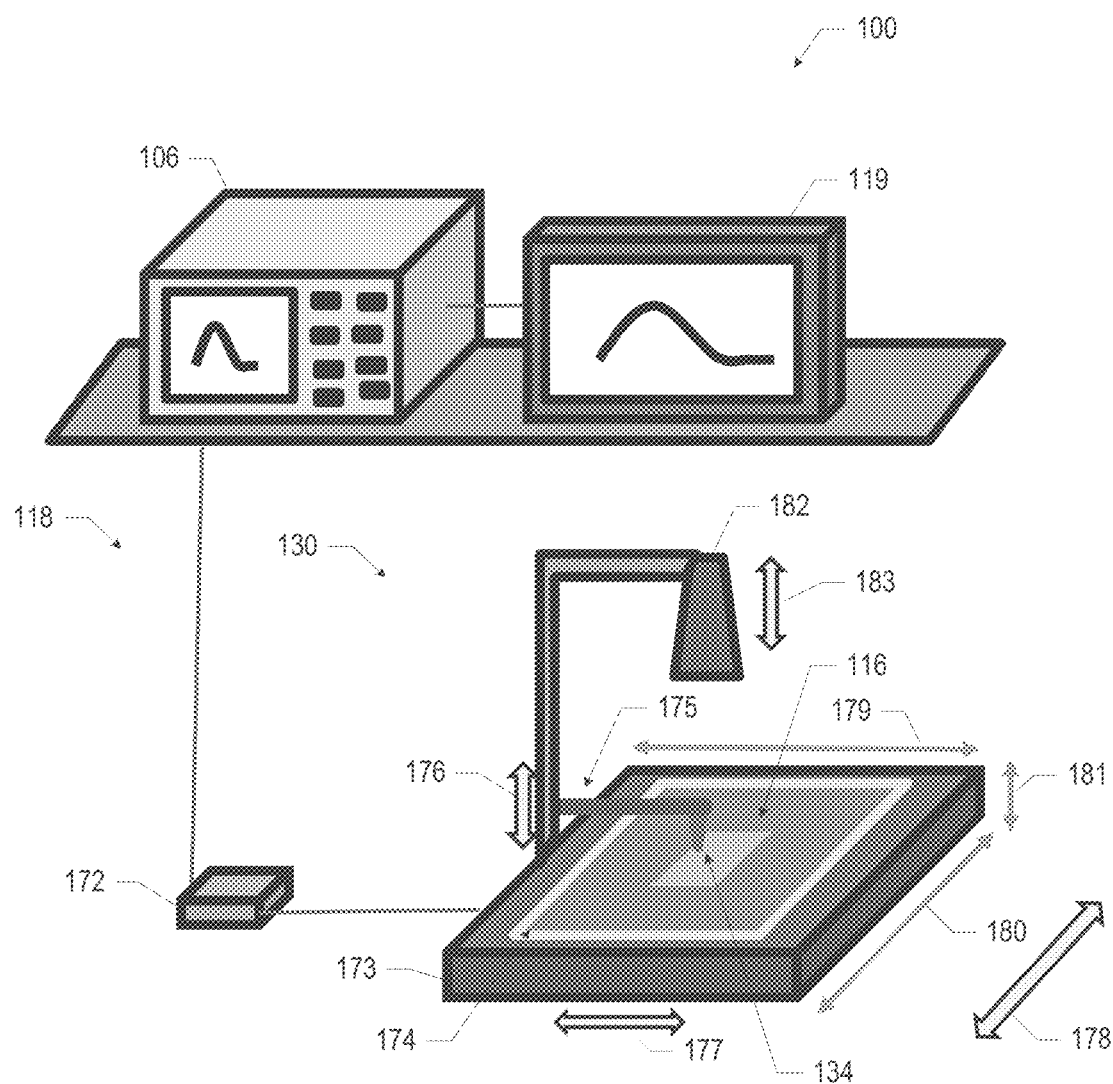
FIG. 13 is a diagram of an example of a fine-pitch probe station for time domain reflectometry (TDR) that may be included in a transmission medium characterization system, in accordance with various embodiments.

Example embodiments of the fine-pitch TDR probe station 130, the manual probe TDR probe station 132, and the fine-pitch TDT probe station 135 are discussed in detail below with reference to FIGS. 13,14, and 15, respectively.

Figure 3:
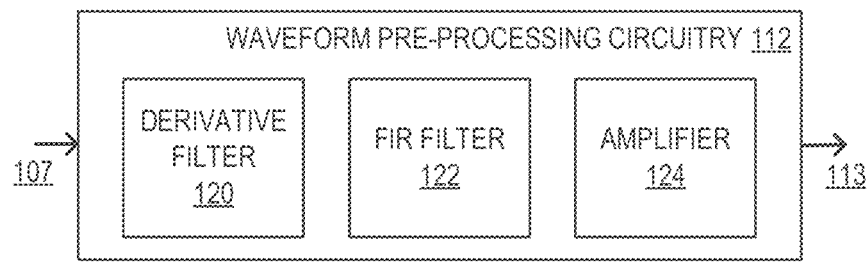
FIG. 3 is a block diagram of example waveform pre-processing circuitry that may be included in a transmission medium characterization system, in accordance with various embodiments.

A number of circuits and techniques for processing an initial input waveform 107 (to generate a processed input waveform 113 for provision to the transmission medium 116) are disclosed herein. For example, FIG. 3 is a block diagram of waveform pre-processing circuitry 112 that may be included in the system 102, in accordance with various embodiments. The waveform pre-processing circuitry 112 of FIG. 3 may include a derivative filter 120, a finite impulse response (FIR) filter 122, and an amplifier 124. Any combination of these components of the waveform pre-processing circuitry 112 may be used in various embodiments of the system 102 (e.g., any of these components alone, any pair of these components, or all three of these components).

The derivative filter 120 may be a digital or analog filter that receives an input signal and generates an output signal representative of an approximate time derivative of the input signal. For example, an "ideal" implementation of the derivative filter 120 may, in response to receipt of an input signal having the form of a step function, generate an output signal having the form of an impulse function, as known in the art. The derivative filter 120 may be a particular example of a high-pass filter that may be included in the waveform pre-processing circuitry 112.

Figure 4:
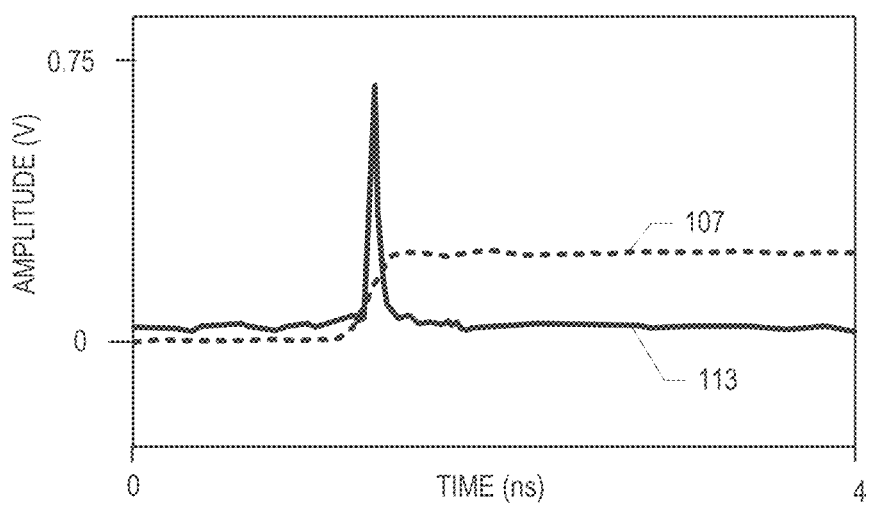
FIG. 4 is a plot of example initial and processed input waveforms that may be generated by a transmission medium characterization system, in accordance with various embodiments.

FIG. 4 is a plot of an example initial input waveform 107 and a corresponding processed input waveform 113 that may be generated by an embodiment of the system 102 in which the waveform pre-processing circuitry 112 includes the derivative filter 120. The initial input waveform 107 of FIG. 4 may be a step function generated by the waveform generator 106, and the processed input waveform 113 may be an approximate impulse function, having a large peak corresponding to the "ramp" portion of the initial input waveform 107. In some embodiments, the ramp portion of the initial input waveform 107 may be steep, corresponding to a total rise time of 5-20 picoseconds, for example. When the initial input waveform 107 includes one or more steep ramp portions, the derivative filter 120 may generate a corresponding peak in the processed input waveform 113. Depending upon the form of the initial input waveform 107, the processed input waveform 113 may have a maximum amplitude greater than a maximum amplitude of the initial input waveform 107. For example, in the embodiment illustrated in FIG. 4, the maximum amplitude of the processed input waveform 113 (occurring at the top of the peak) may be greater than the maximum amplitude of the initial input waveform 107 (occurring along the relatively "flat" step portion), in FIG. 4, for example, the maximum amplitude of the initial input waveform 107 is approximately 0.25V, while the maximum amplitude of the processed input waveform 113 it approximately 0.75V (a 3× difference). The derivative filter 320 may thus have the effect of increasing the instantaneous power of the processed input waveform 113 relative to the initial input waveform 107 near the peak of the processed input waveform 113.

The conventional understanding of TDR and TDT systems has been that high-frequency input signals are not desirable because the high-frequency content tends to dissipate in the transmission medium under test. The rise of a step function, for example, tends to spread and shrink, making detection at the output difficult. A derivative filter 120, as noted above, operates as a high-pass filter, and thus is selective for such high-frequency content. Thus, the use of such a derivative filter is counter to the conventional understanding, and represents the recognition that the increase in maximum amplitude, and the sharpness of the initial peak, that accompanies the generation of an impulse from a step function may provide overall peak detection advantages not achievable by conventional systems.

When the derivative filter 120 is implemented digitally, the bandwidth of the processed input waveform 113 may be adjusted by adjusting the sampling frequency of the processed input waveform; smaller time steps may enable sharper peaks (and therefore higher bandwidth). The ability to adjust the bandwidth of the processed input waveform 113 may be used advantageously to tune the processed input waveform 113 based on the signal frequencies of interest and the frequency response of the transmission medium 116 to achieve a desired sensitivity and resolution.

Returning to FIG. 3, the waveform pre-processing circuitry 112 may include an FIR filter 122. As known in the art, an FIR filter may take the following form:

$$y[n] = \Sigma_{k=M}^{N} c_k x[n-K]$$

where y[n] is the output of the FIR filter, x[n] is the input to the FIR filter, the $c_k$ are the multiplicative coefficients corresponding to the different taps of the FIR filter, and M and N are integers. Special cases of the generic FIR filter denoted above include three-tap filters, some examples of which include:

$$y[n] = c_0 x[n] + c_1 x[n-1] + c_2 x[n-2]$$

and $$y[n] = c_{-1} x[n+1] + c_0 x[n] + c_1 x[n-1]$$

The FIR filter 122 may have two, three, or more taps, and may serve as a feed forward equalizer (FFE) to compensate for the low-pass behavior of the transmission medium 116 by flattening the frequency response of the combination of the FIR filter 122 and the transmission medium 116. In particular, in some embodiments, the coefficients $c_k$ of the FIR filter 122 may be selected such that the impulse response of the combination of the FIR filter 122 and the transmission medium 116 includes zero-crossings on either side of the origin. Such an implementation of the FIR filter 122 may cause the FIR filler 122 to act as a high-pass filter; more generally, the FIR filter 122 may take the form of another high-pass filter.

Figures 5A, 5B:
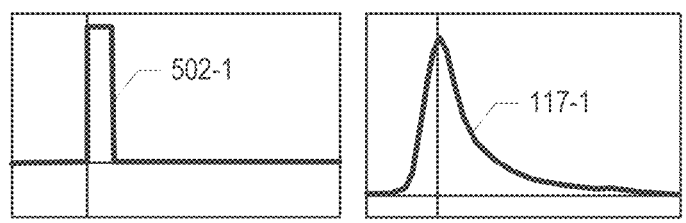
FIGS. 5A-5D are plots of example input waveforms and their corresponding output waveforms in a transmission medium characterization system, in accordance with various embodiments.
Figures 5C, 5D:
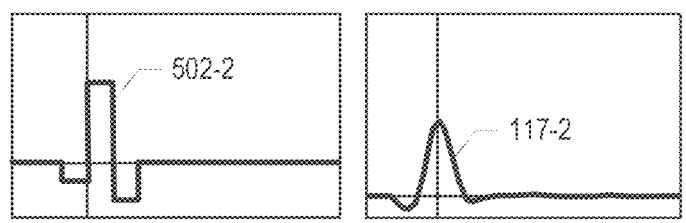

For example, FIGS. 5A-5D are plots of example processed input waveforms 113 and their corresponding initial output waveforms 117 in the system 102 showing the effects of the inclusion of an FIR filter 122 in the waveform pre-processing circuitry 112, in accordance with various embodiments, in particular, FIGS. 5A and 5B illustrate examples in which the waveform pre-processing circuitry 112 does not include an FIR filter 122, and FIGS. 5C and 5D illustrate examples in which the waveform pre-processing circuitry 112 does include an FIR filter 122. In particular. FIG. 5A illustrates an input waveform 502-1 that has the form of a sampled-and-held impulse. In some embodiments, the input waveform 502-1 of FIG. 5A may be the output of the derivative filter 120 after it has acted on an initial input waveform 107 having the form of a step function, as discussed above. FIG. 5B illustrates the initial output waveform 117-1 that may be output from the transmission medium 116 in response to the input waveform 502-1. If the input waveform 502-1 is an impulse, the initial output waveform 117-1 may represent the impulse response of the transmission medium 116.

FIG. 5C illustrates an input waveform 502-2 that represents the output of the FIR filter 122 in response to an input of the form of the input waveform 502-1. In particular, the FIR filter 122 applied to the input waveform 502-1 to generate the input waveform 502-2 may take the following form:

$$y[n] = -0.1 x[n+1] + 0.6 x[n] - 0.3 x[n-1]$$

As discussed above with reference to FIG. 5A, in some embodiments, the input waveform 502-2 may result from supplying an initial input waveform 107, having the form of a step function, to the derivative filter 120 and the FIR filter 122. FIG. 5D illustrates the initial output waveform 117-2 that may be output from the transmission medium 116 in response to the input waveform 502-2. Note the zero-crossings of the initial output waveform 117-2 on either side of the time origin (e.g., at approximately −1 and +1 in FIG. 5D), and the consequent fast decay of the initial output waveform 117-2 relative to the long slow decay of the initial output waveform 117-1. Although the maximum amplitude of the initial output waveform 117-2 is less than the maximum amplitude or the initial output waveform 117-1, the peak of the initial output waveform 117-2 is more sharply defined in time than the peak of the initial output waveform 117-1, and thus the peak of the initial output waveform 117-2 may be easier to detect in the presence of noise than the peak of the initial output waveform 117-1. This may be advantageous in TDR and TDT applications, in which the peaks in the reflected or transmitted signals, respectively, may indicate discontinuities or other features of the transmission medium 116. Consequently, the use of an FIR filter 122 in the waveform pre-processing circuitry 112 may improve the performance of the system 102.

Figure 6:
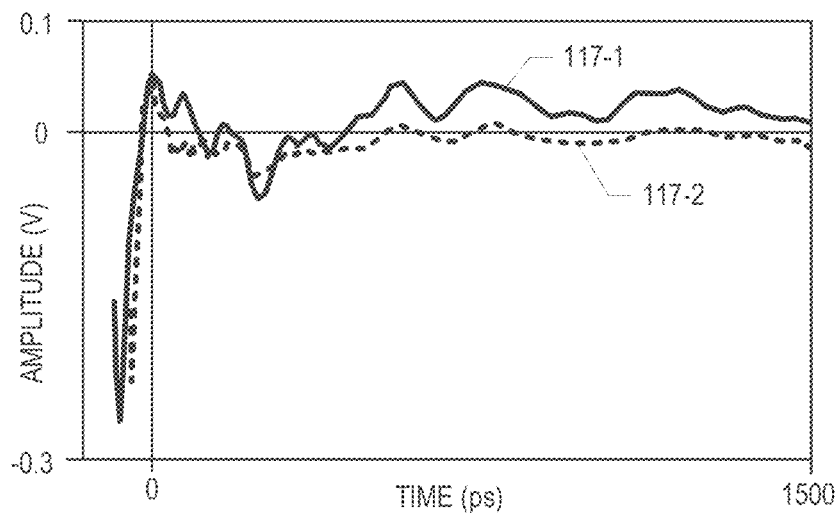
FIG. 6 is a plot of example output waveforms generated in response to input waveforms having undergone different amplifications in a transmission medium characterization system, in accordance with various embodiments.

Returning to FIG. 3, the waveform pre-processing circuitry 112 may include an amplifier 124. The amplifier 124 may take the form of any known circuitry for increasing the amplitude of a signal input to the amplifier 124 (e.g., a voltage, a current, an optical, or other signal). Amplifying the initial input waveform 107 may increase the likelihood that features of the reflected or transmitted waveforms will have enough energy to appear in the initial output waveform 117, and will not be attenuated within the transmission medium 116 itself. For example, FIG. 6 is a plot of example initial output waveforms 117-1 and 117-2 generated in response to corresponding processed input waveforms 113 (not shown) having undergone different amplifications by the amplifier 124, in accordance with various embodiments. In particular, the initial output waveform 117-1 represents the output of the transmission medium 116 in response to a processed input waveform 113 that underwent greater amplification than the processed input waveform corresponding let the initial output waveform 117-2. As can be seen in FIG. 6, the peaks and valleys of the initial output waveform 117-1 are more distinct than the peaks and valleys of the initial output waveform 117-2, which may improve performance of the system 102. As noted above, in some embodiments, the waveform pre-processing circuitry 112 may include the amplifier 124, the FIR filter 122, and the derivative filter 120, or any combination of the three. The gain applied by the amplifier 124 may take any suitable value, for example, in some embodiments, the gain may be 2-30× (e.g., 20×). In FIG. 6, the amplification factor between the input waveforms that resulted in the initial output waveform 117-1 and the initial output waveform 117-2 may be approximately 4.4×.

Figure 7:
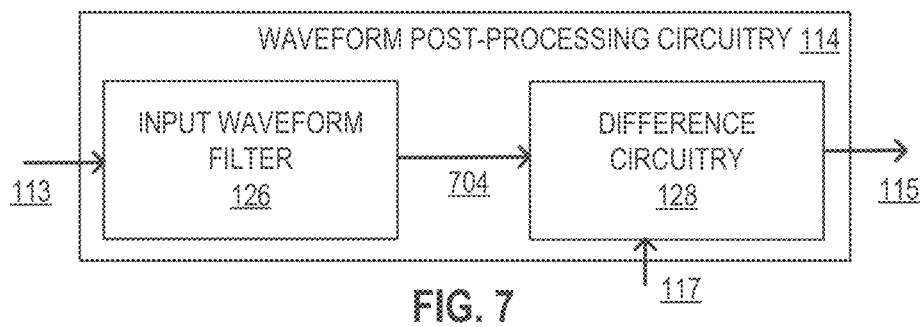
FIG. 7 is a block diagram of example waveform post processing circuitry that may be included in a transmission medium characterization system, in accordance with various embodiments.

A number of circuits and techniques for processing an initial output waveform 117 (output from the transmission medium 116) to generate a processed output waveform 115 are also disclosed herein. For example, FIG. 7 is a block diagram of waveform post-processing circuitry 114 that may be included in the system 102, in accordance with various embodiments. The waveform post processing circuitry 114 may include an input waveform filter 126 and difference circuitry 128, and may be arranged such that the waveform post-processing circuitry 114 is to process the processed input waveform 113 with the input waveform filter 126 to generate a filtered version 704 of the processed input waveform 113. The difference circuitry 128 may subtract the filtered version 704 from the initial output waveform 117 to generate the processed output waveform 115. Note that, when the waveform pre-processing circuitry 112 is not included in the system 102, the processed input waveform 113 may be identical to the initial input waveform 107.

The input waveform filter 126 may be designed to emulate the delay and high-frequency attenuation experienced by a waveform as it travels through the transmission medium 116. This attenuation may be a function of the geometry and materials of the transmission medium 116, and may appear in the initial output waveform 117. By filtering the processed input waveform 113 with the input waveform filter 126 to generate the filtered version 704, then subtracting the filtered version 704 from the initial output waveform 117, these low-pass effects may be effectively "canceled" from the initial out put waveform 117, making the peaks and valleys of the resulting signal clearer and improving TDR/TDT performance.

Figure 8:
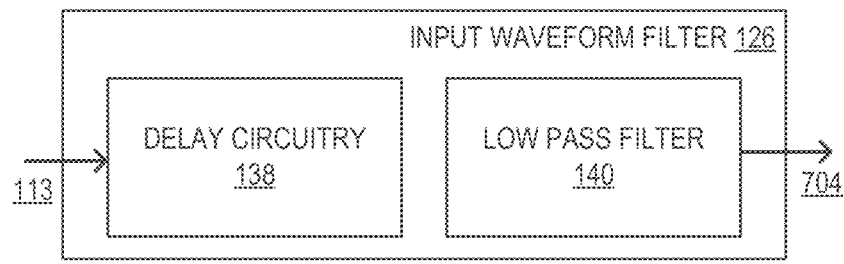
FIG. 8 is a block diagram of an example of an input waveform filter that may be included in the waveform post-processing circuitry of FIG. 7, in accordance with various embodiments.

FIG. 8 is a block diagram of an example of an input waveform filter 126 that may be included in the waveform post-processing circuitry 114 of FIG. 7, in accordance with various embodiments. The input waveform filter 126 may include delay circuitry 138 and a low-pass filter 140. The delay circuitry 138 may be tuned to delay the processed input waveform 113 by the approximate amount of time it takes for the processed input waveform 113 to travel into and out of the transmission medium 116; that time may be readily determined experimentally for the particular transmission medium 116 under test. The low pass filter 140 may have parameters selected to replicate the low-pass filter effects of the transmission medium 116, and may also be determined experimentally (e.g., as discussed below). In some embodiments, the low-pass filter 140 may be a first-order filter, representing a resistor-capicitor (R-C) filter model of the high-frequency attenuation that occurs in the transmission medium 116. In such an embodiment (or in an embodiment in which the low-pass filter 140 is a higher-order filter), a decay time constant of the low-pass filter 140 may be selected to match an experimentally determined decay time constant of the initial output waveform 117 (e.g., a decay time constant equal to the product of R and C in a low-pass R-C filter circuit). The experiment determined decay time constant of the initial output waveform 117 may be generated by fitting a curve representative of an particular low-pass filter (taking a desired form) to at least a portion of the decaying tail of the initial output waveform 117 in order to determine appropriate decay parameters that can be provided to the low-pass filter 140. For example, a first-order model of may take the form:

$$v(t) = v_0 e^{-t/\tau}$$

where v0 is the voltage at time 0 and t is the decay time constant (equal to the product of R and C in a low-pass R-C filter circuit). The model used for the low-pass filter 140 may be a first-order model, or a higher-order model, as desired.

The filtered version 704 of the processed input waveform 113 may represent the initial output waveform 117 expected under "ideal" conditions in which the transmission medium 116 only imposes a delay and high-frequency attenuation on the processed input waveform 113.

Figure 9:
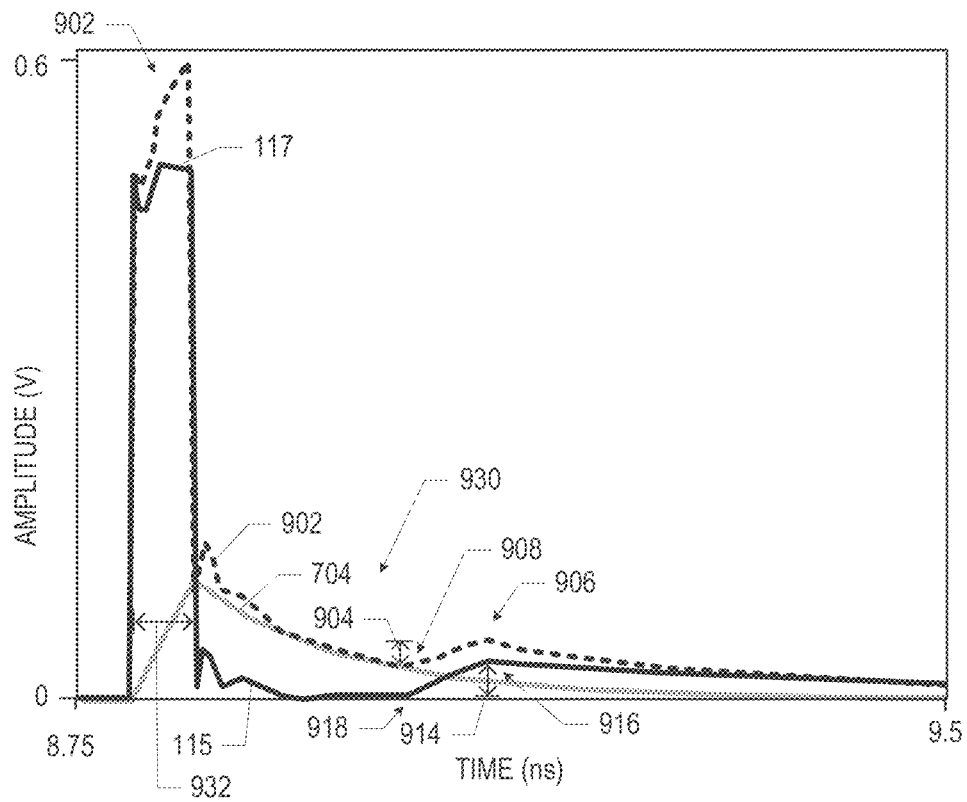
FIG. 9 is a plot depicting example waveforms that may be processed or generated by the waveform post processing circuitry of FIG. 7, in accordance with various embodiments.

FIG. 9 is a plot depicting example waveforms that may be processed or generated by the waveform post-processing circuitry 114 of FIG. 7, in accordance with various embodiments. In particular, FIG. 9 depicts an example initial output waveform 117 that may be received by the waveform post-processing circuitry 114 (represented in FIG. 9 by the dashed line). The initial output waveform 117 may have initial peak 902, followed by an extended, decaying tail 930, as shown. An approximate decay time constant for that tail 930, and a delay 932 (in FIG. 9, approximately 9 nanoseconds), may be determined experimentally (e.g., as discussed above), and these parameters may be used to configure the low-pass filter 140 and the delay circuitry 138, respectively. FIG. 9 depicts an example filtered version 704 (represented by the gray line) of a processed input waveform 113 (not shown, but which may take the form of an impulse or other suitable shape, as discussed above). Note that the filtered version 704 includes an extended tail whose curvature approximately matches the curvature of the tail 930 of the initial output waveform 117. FIG. 9 also depicts an example processed output waveform 115 that may be generated by the difference circuitry 128 when the filtered version 704 is subtracted from the initial output waveform 117.

The processed output waveform 115 may be advantageous for use with TDT/TDR relative to the initial output waveform 117, at least because the processed output waveform 115 provides greater amplitude differences between its peaks and valleys. For example, the initial output waveform 117 includes a peak 906, a valley 908, and an amplitude difference 904 between the peak 906 and the valley 908 that is equal to approximately 11 millivolts. The processed output waveform 115 includes a corresponding peak 916, a corresponding valley 918, and an amplitude difference 914 between the peak 916 and the valley 918 that is equal to approximately 27 millivolts. The amplitude difference 914 is greater than the amplitude difference 904 (by a factor of approximately 2.7), which may render the peak 916/valley 918 easier to distinguish in the processed output waveform 115 than the peak 906/valley 908 in the initial output waveform 117.

Returning to FIG. 1, in some embodiments, the waveform generator 106 may be a dedicated waveform generation device that is housed separately from other components of the system 102. The waveform generator 106 may generate a digital waveform (that may then be converted to an analog waveform by the waveform pre-processing circuitry 112 or the interface circuitry 118) or an analog waveform, in some embodiments, the waveform generator 106 may generate a waveform in digital form and may convert that digital waveform into an analog waveform using a built-in digital to analog converter (DAC). In particular, in some embodiments, the waveform generator 106 may include a signal generator and a signal converter. The processed output waveform 115 may be an analog waveform or may be a digital waveform (converted to digital form by the waveform post-processing circuitry 114 or the interface circuitry 118).

As noted above, the input device 108 may be used to specify operational parameters of the system 102, and generally controls testing using the system 102. For example, the input device 108 (e.g., including a keyboard, mouse, touchscreen, network communication device, etc.) may be used to specify a waveform shape and amplitude for the initial input waveform 107 generated by the waveform generator 106; specify the probe arrangement in the interface circuitry 118; specify whether or not the derivative filter 120 is to be applied; specify the parameters of the FIR filter 122; specify the gain of the amplifier 124; specify the delay of the delay circuitry 138; or specify the parameters of the low pass filter 140. Although referred to in the singular herein, the input device 108 may include any of a number of input devices, such as any of the input devices discussed below with reference to FIG. 12. In some embodiments, the input device 108 may include physically separate input devices for different functionality of the system 102; for example, the input device 108 may include buttons or knobs to control the output of the waveform generator 106, and a separate keyboard, mouse, or touchscreen for providing other operational parameters of the system 102.

The initial input waveform 107, the processed input waveform 113, the initial output waveform 117, the processed output waveform 115, and/or any of the operational parameters of the system 102 may be stored, displayed, or transmitted by the output device 110. In some embodiments, operation of the system 102 may be managed by a graphical user interface (GUI) to which the input device 103 and output device no are coupled.

Figure 10:
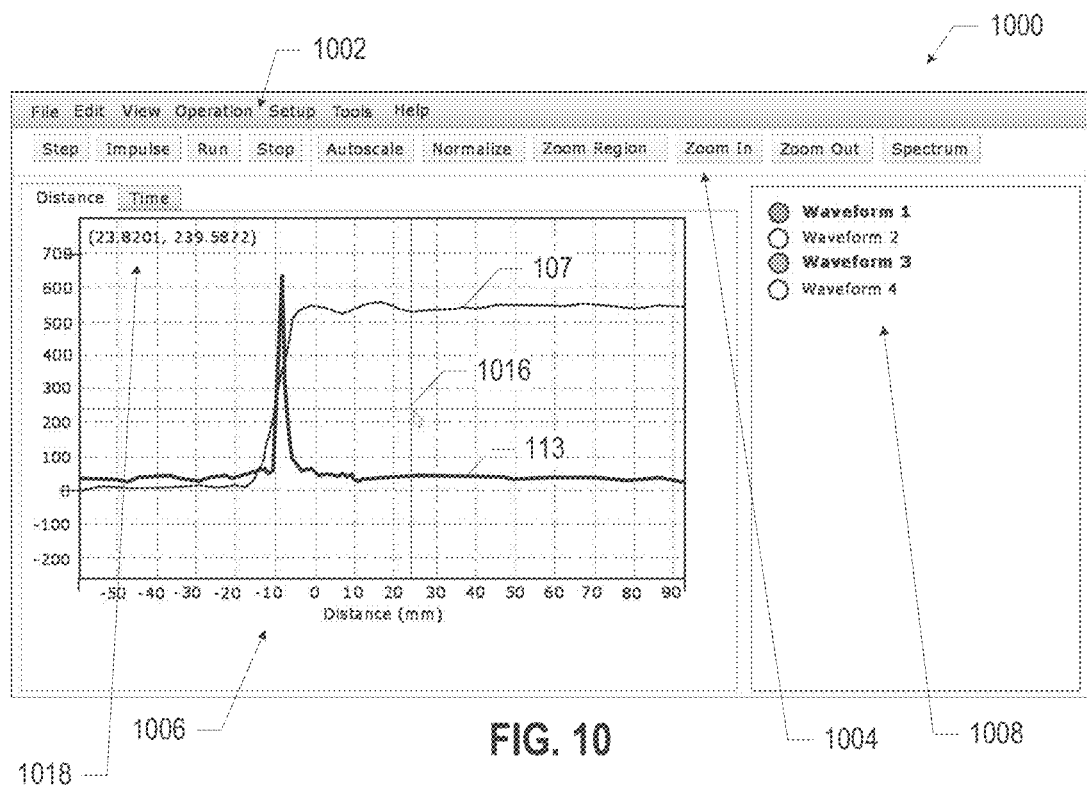
FIG. 10 depicts an example display of a graphical user interface of a transmission medium characterization system, in accordance with various embodiments.

FIG. 10 depicts an example display 1000 of a GUI for the system 102, in accordance with various embodiments. The display 1000 may include system-level elements 1002, control elements 1004, a plot display window 1006, and a plot information window 1008. Elements in the display 1000 may be configured such that a user can interact with the element via the input device 108 in any of a number of ways (e.g., tapping a touchscreen, right-or left-clicking with a mouse, etc.).

The system-level elements 1002 may include a "file" element, an "edit" element, a "view" element, an "operation" element, a "setup" element, a "tools" element, and a "help" element, as shown. Clicking on or otherwise selecting the "file" element may result in a drop-down menu that allows a user to create a new project, open an existing project, save a project, import waveforms into a current project, remove waveforms from the current project, save waveforms, save the display, export data from a plot, or exit the GUI, for example. Clicking on or otherwise selecting the "edit" element may result in a drop-down menu that allows a user to show/hide plots, set the color of plots, rename plots, edit a plot legend, or adjust the alignment of plots, for example. Clicking on or otherwise selecting the "view" element may result in a drop-down menu that allows the user to determine whether or not the control elements 1004 are displayed, control whether the plot information window 1008 is displayed, control whether log information is displayed, perform an auto scale of a plot, normalize a plot, identify a zoom region for a plot, zoom in on a plot, zoom out of a plot, or display the range of a plot, for example. Clicking on or otherwise selecting the "operation" element may result in a drop down menu that allows a user to select between a step-shaped processed input waveform 113 (the "step" element), an impulse-shaped processed input waveform 113 (the "input" element"), and control the hardware to perform the selected tests and display the results in real-time (the "run" element). Clicking on or otherwise selecting the "setup" element may allow the user to calibrate and configure the system 102 (e.g., to prepare the hardware and software of the system 102 to perform a test and display the results). Clicking on or otherwise selecting the "tools" element may result in a drop-down menu that allows a user to select operations to interpret and process the input and output waveforms to determine characteristics of interest in the test inputs and results (e.g., rise times, differences between signals for a "known good" device and a device under test, etc.). Clicking on or otherwise selecting the "help" element may allow the user to access frequently asked questions or other help files, or learn more about the GUI (e.g., the version, the developer, etc.).

The control elements 1004 may include a "step" element (to select a step-shaped processed input waveform 113), an "impulse" element (to select an impulse-shaped processed input waveform 113), a "run" element (to begin a test), a "stop" element (to stop a test, e.g., when the data has stabilized), an "autoscale" element (to fit displayed waveforms to the display area), a "normalize" element (to normalize one or more of the axes to a predetermined range), a "zoom region" element (to zoom in on a selected region in the plot display window 1006), a "zoom in" element, a "zoom out" element, and a "spectrum" element (to display spectral comment of a waveform of interest, e.g., to determine its bandwidth). Some of the control elements 1004 may be "shortcuts" for functionality that can be accessed by other pathways in the GUI (e.g., through the system-level elements 1002).

By positioning a cursor over the plot display window 1006, crosshairs 1016 may be displayed in the cursor position along with the coordinates 1018 of the crosshairs 1016 according to the scale of the displayed plot (and selected waveform). Further plot options may be accessed by right-clicking or otherwise actuating an area in the plot display window 1006 (e.g., a configuration menu, an "add current waveform" option, a "save screen image" option, an "export plot data" option, an "autoscale" option, a "normalize" option, a "zoom region" option, a "zoom in" option, a "zoom out" option, a "previous view" option, an "edit legend" option, and/or a "measurement" option). Note that the initial input waveform 107 and the processed input waveform 113 displayed in the plot display window 1006 are not shown on the same y-scale; a user may use the GUI to put both waveforms on the same scale, or may specify independent y-scales for the different waveforms, as desired. The x-axis of the plot in the plot display window 1006 is specified by the distance into the transmission medium 116, but a user may select the "Time" tab to switch to a display whose x-axis relates to the time progression of the waveforms in the plot display window 1006 (related to the distance by the speed of signal propagation in the transmission medium 116, as known in the art).

By clicking on or otherwise selecting entries in the plot information window 1008, further information and operations related to various waveforms may be displayed (e.g., a "hide plots" option, a "set color" option, a "rename plot" option, a "delete plots" option, an "edit legend" option, an "alignment" option, a "measurement" option, a "subtract plot" option, and/or a "processing" option).

The display 1000, or another GUI, may be part of the system 102, and may offer multiple user-selectable functionalities. For example, as discussed above, the system 102 may be configured for providing a step function as the input waveform to the transmission medium 116, providing an impulse as the input waveform to the transmission medium 116 (e.g., as discussed above with reference to FIGS. 3-4), or providing a waveform having another shape as the input waveform to the transmission medium 116. In another example, a user may control the performance of a de-convolution operation in the system 102 to identify and remove inherent system noise from the waveforms. In another example, the system 102 may include a database of two- or three-dimensional design files of the structure of the transmission medium 116; when a user detects a fault at a particular distance in the transmission medium 116 (e.g., by identifying a feature in the plot display window 1006 when the x-axis indicates distance) and indicates this detection in the display 1000 (or another GUI), the output device 110 may respond by displaying the portion of the design files around the particular distance so the user can study the relevant area of the transmission medium 116 in detail. The system 102 may be configured for TDR or TDT, and/or for fine-pitch or manual probing (e.g., as discussed above with reference to FIG. 2).

Figure 11:
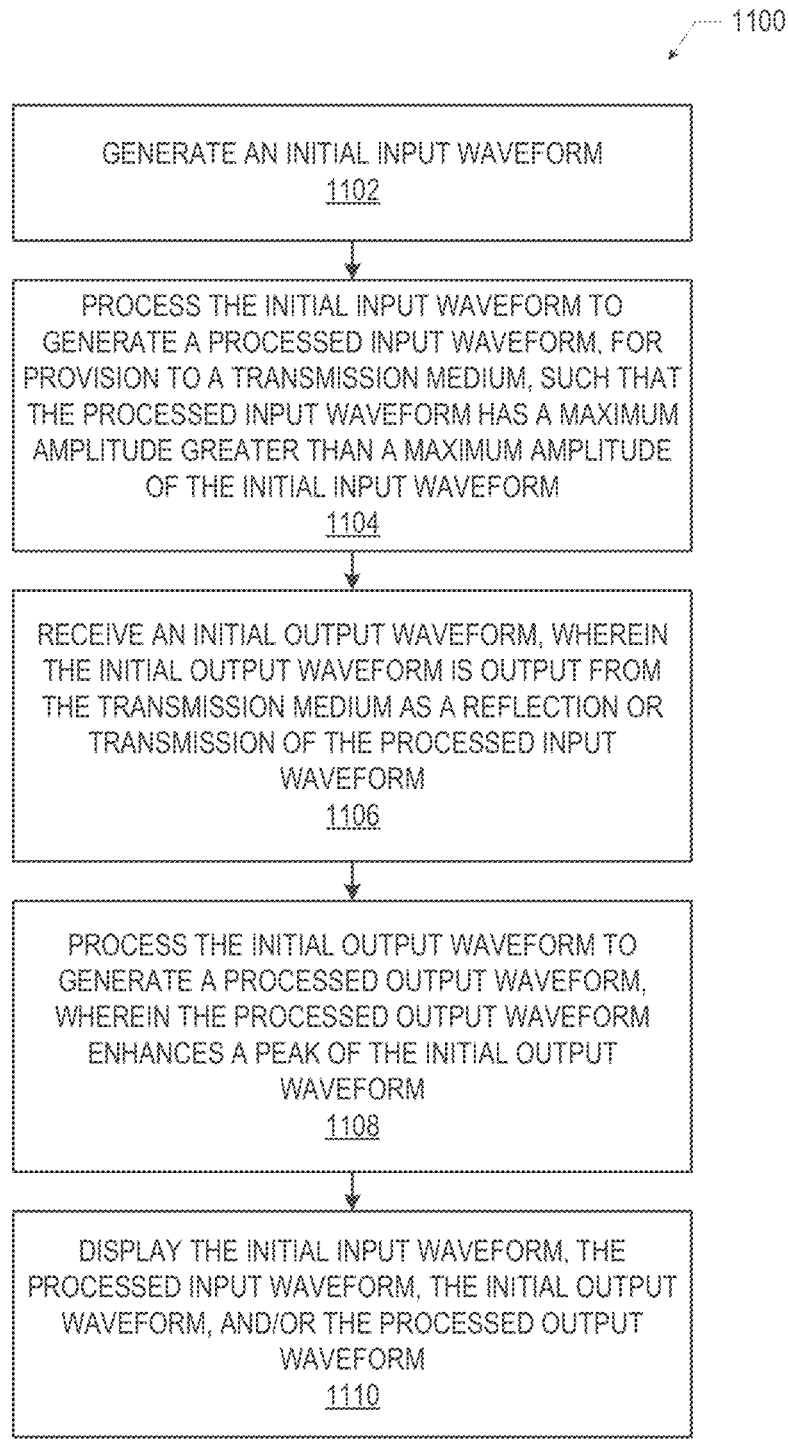
FIG. 11 is a flow diagram of a method of characterizing a transmission medium, in accordance with various embodiments.

FIG. 11 is a flow diagram of a method 1100 of characterizing a transmission medium, in accordance with various embodiments. The operations discussed below with reference to the method 1100 may be illustrated by reference to the system 102, but any suitable device or devices may perform the method 1100. Although FIG. 11 illustrates various operations once each, in a particular order, any of the operations of the method 1100 may be performed multiple times and/or in a different order (e.g., in parallel). Additionally, various operations of the method 1100 may be omitted in some embodiments. For example, in some embodiments, the processing operations discussed with reference to 1104 may be omitted. In some embodiments, the processing operations discussed with reference to 1108 may be omitted.

At 1102, an initial input waveform may be generated. For example, the waveform generator 106 may generate the initial input waveform 107, in accordance with any of the embodiments disclosed herein. In some embodiments, the initial input waveform generated at 1102 may be a step function.

At 1104, the initial input waveform (generated at 1102) may be processed to generate a processed input waveform for provision to a transmission medium. The processed input waveform may have a maximum amplitude greater than the maximum amplitude of the initial input waveform. For example, the waveform pre-processing circuitry 112 may process the initial input waveform 107 to generate the processed input waveform 113. In accordance with any of the embodiments disclosed herein, in some embodiments, the processing that occurs at 1104 may include applying a derivative filter (e.g., the derivative filter 120). In some embodiments, the processing that occurs at 1104 may include applying an FIR filter (e.g., the FIR filter 122). In some embodiments, the processing that occurs at 1104 may include amplifying the initial input waveform (e.g., using the amplifier 124). For example, in some embodiments, the initial input waveform may be a step function, and a derivative filter, an FIR filter, and amplifier may process the initial input waveform at 1104.

At 1106, an initial output waveform may be received. The initial output waveform may be output from the transmission medium as a reflection or transmission of the process input waveform (1104). For example, the initial output waveform 117 may be received by the waveform post-processing circuitry 114.

At 1108, the initial output waveform (received at 1106) may be processed to generate a processed output waveform. The processing performed to generate the processed output wave form may enhance the peak of the initial output waveform. For example, the processed output waveform may be generated by subtracting a filtered version of the processed input waveform (e.g., processed by the input waveform filter 126) from the initial output waveform.

At 1110, the initial input waveform, the processed input waveform, the initial output waveform, and/or the processed output waveform may be displayed. For example, the initial input waveform 107, the processed input waveform 113, the initial output waveform 117, and/or the processed output waveform 115 may be displayed on a display device included in the output device 110. In some embodiments, the display operations included in 1110 may be part of the operation of a GUI (e.g., the GUI discussed above with reference to FIG. 10).

Figure 12:
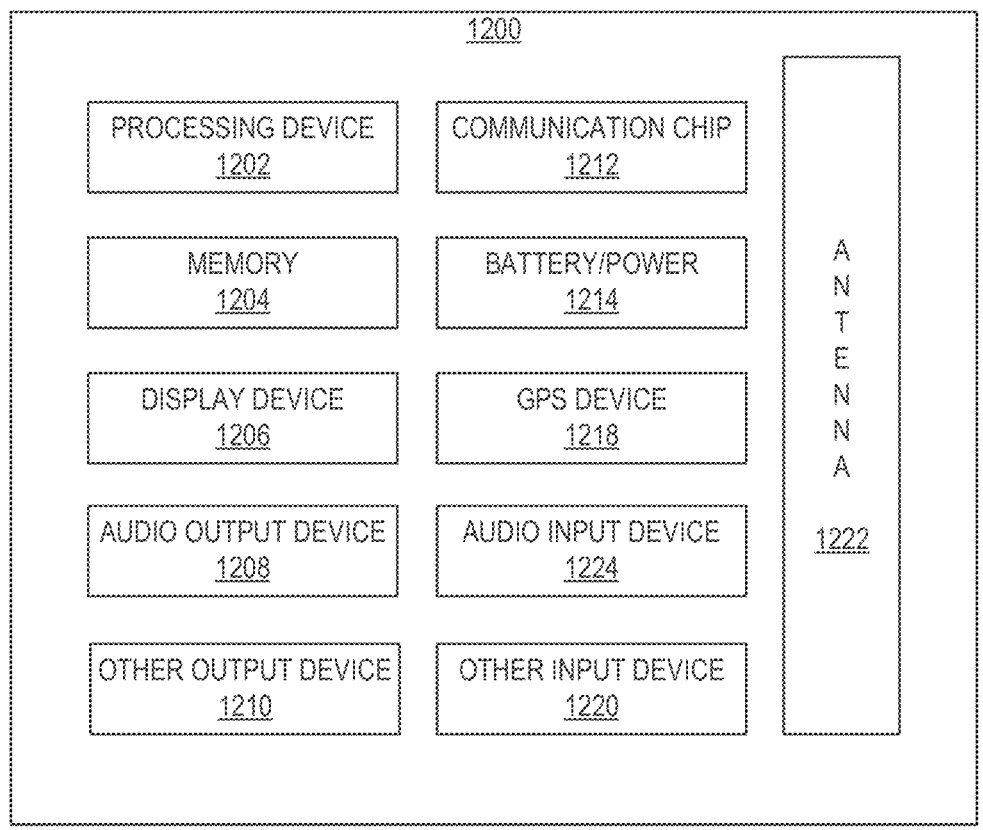
FIG. 12 is a block diagram of a computing device that may be used to implement various components of the systems disclosed herein, in accordance with various embodiments.

FIG. 12 is a block diagram of a computing device 1200 that may be used to implement various components of the systems disclosed herein, in accordance with various embodiments. For example, some or all of the components of the computing device 1200 may be included in the waveform processing circuitry 104, the waveform generator 106, the input device 108, the output device 110, and/or the interface circuitry 118. A number of elements are illustrated in FIG. 12 as included in the computing device 1200, but any one or more of these elements may be omitted or duplicated, as suitable for the application.

Additionally, in various embodiments, the computing device 1200 may not include one or more of the elements illustrated in FIG. 12, but the computing device 1200 may include interface circuitry for coupling to the one or more elements. For example, the computing device 1200 may not include a display device 1206, but may include display device interface circuitry (e.g., a connector and driver circuitry) to which a display device 1206 may be coupled, in another set of examples, the computing device 1200 may not include an audio input device 1224 or an audio output device 1208, but may include audio input or output device interface circuitry (e.g., connectors and supporting circuitry) to which an audio input device 1224 or audio output device 1208 may be coupled.

The computing device 1200 may include a processing device 1202 (e.g., one or more processing devices). As used herein, the term "processing device" or "processor" may refer to any device or portion oi a device that processes electronic data from registers and/or memory to transform that electronic data into other electronic data that may be stored in registers and/or memory. The processing device 1202 may include one or more digital signal processors (DSPs), application-specific integrated circuits (ASICs), central processing units (CPUs), graphics processing units (GPUs), cryptoprocessors, server processors, or any other suitable processing devices. For example, the processing device 1202 may include one or more processing devices programmed to implement any one or more functions of the waveform processing circuitry 104 disclosed herein. The computing device 1200 may include a memory 1204, which may itself include one or more memory devices such as volatile memory (e.g., dynamic random access memory (DRAM)), nonvolatile memory (e.g., read-only memory (ROM)), flash memory, solid state memory, and/or a hard drive, in some embodiments, the memory 1204 may include one or more computer readable media (e.g., non-transitory computer readable media, such as any of the non-transitory media noted above) having instructions thereon that, in response to execution by the processing device 1202, may cause the computing device 1200 to perform any of the processes disclosed herein.

In some embodiments, the computing device 1200 may include a communication chip 1212 (e.g., one or more communication chips). The communication chip 1212 may, for example, be included in the input device 108 (e.g., to receive inputs to the system 102) and/or the output device 110 (e.g., to provide data for transmission out of the system 102). The communication chip 1212 may be configured for managing wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1212 may implement any of a number of wireless standards or protocols, including but not limited to institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide interoperability for Microwave Access, which is a certification mark for products that pass conformity and interoperability rests for the IEEE 802.16 standards. The communication chip 1212 may operate in accordance with a Global System for Mobile communication (GSM), General Packet Radio Service (GPRS), Universal Mobile Telecommunications System (UMTS), High Speed Packet Access (HSPA), Evolved HSPA (E-HSPA), or LTE network. The communication chip 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1212 may operate in accordance with other wireless protocols in other embodiments. The computing device 1200 may include an antenna 1222 to facilitate wireless communications and/or to receive other wireless communications (such as AM or FM radio transmissions).

In some embodiments, the communication chip 1212 may manage wired communications, such as electrical, optical, or any other suitable communication protocols (e.g., the Ethernet). As noted above, the communication chip 1212 may include multiple communication chips, for instance, a first communication chip 1212 may be dedicated to shorter-range wireless communications such as Wi-Fi or Bluetooth, and a second communication chip 1212 may be dedicated to longer-range wireless communications such as a global positioning system (GPS), EDGE, GPRS, CDMA, WiMAX, LTE, EV-DO, or others. In some embodiments, a first communication chip 1212 may be dedicated to wireless communications, and a second communication chip 1212 may be dedicated to wired communications.

The computing device 1200 may include battery/power circuitry 1214. The battery/power circuitry 1214 may induce one or more energy storage devices (e.g., batteries or capacitors) and/or circuitry for coupling elements of the computing device 1200 to an energy source separate from the computing device 1200 (e.g., AC line power).

The computing device 1200 may include a display device 1206 (or corresponding interface circuitry, as discussed above). The display device 1206 may be, or may be part of, the output device 110. The display device 1206 may include any visual indicators, such as a heads-up display, a computer monitor, a projector, a touchscreen display, a liquid crystal display (LCD), a light-emitting diode display, or a flat panel display, for example. The display device 1206 may be used to render the display elements of the GUI discussed above with reference to FIG. 10, for example.

The computing device 1200 may include an audio output device 1208 (or corresponding interface circuitry, as discussed above). The audio output device 1208 may be, or may be part of, the output device 110. The audio output device 1208 may include any device that generates an audible indicator, such as speakers, headsets, or earbuds, for example.

The computing device 1200 may include an audio input device 1224 (or corresponding interface circuitry, as discussed above). The audio input device 1224 may be, or may be part of, the input device 108. The audio input device 1224 may include any device that generates a signal representative of a sound, such as microphones, microphone arrays, or digital instruments (e.g., instrument having a musical instrument digital interface (MIDI) output).

The computing device 1200 may include a global positioning system (GPS) device 1218 (or corresponding interface circuitry, as discussed above). The GPS device 1218 may be in communication with a satellite-based system and may receive a location of the computing device 1200, as known in the art.

The computing device 1206 may include an other output device 1210 (or corresponding interface circuitry, as discussed above). The other output device 1210 may be, or may be part of, the output device 110. Examples of the other output device 1210 may include an audio codec, a video codec, a printer, a wired or wireless transmitter for providing information to other devices, or an additional storage device. Any of the output devices disclosed herein (including the communication chip 1212) may be part of the output device 110 of FIG. 1.

The computing device 1200 may include an other input device 1220 (or corresponding interface circuitry, as discussed above). The other input device 1220 may be, or may be part of, the input device 108. Examples of the other input device 1220 may include an accelerometer, a gyroscope, an image capture device, a keyboard, a cursor control device such as a mouse, a stylus, a touchpad, a bar code reader, a Quick Response (QR) code reader, any sensor, or a radio frequency identification (RFID) reader Any of the input devices disclosed herein (including the communication chip 1212) may be part of the input device 108 of FIG. 1.

Any suitable probe station(s) may be included in the interface circuitry 118. For example, FIG. 13 is a diagram of a system 102 that includes an example of a fine-pitch TDR probe station 130, in accordance with various embodiments. The waveform generator 105 and the computing device 119 may take the form of any of the embodiments discussed above (e.g., with reference to FIG. 2). The interface circuitry 118 of FIG. 13 may include a sample module 172 with circuitry to sample the signals transmitted to/reflected back from the transmission medium 116 (e.g., at any of the sampling frequencies discussed above). A fixture 173 may include an insert plate 174 on which the transmission medium 116 is disposed (e.g., as a device under test, such as an IC package). A coaxial cable 175 may couple the probe 134 to the sample module 172. The z-height of the coaxial cable 175 (and thus the probe 134) may be adjustable, as indicated by the arrow 176. The position of the insert plate 174 may be adjustable in the x-direction (as indicated by the arrow 177) and the y-direction (as indicated by the arrow 178). The fixture 173 may have any suitable shape or dimensions. For example, in some embodiments, the fixture 173 may be rectangular, the width 179 may be between 100 and 150 millimeters (e.g., 120 millimeters), the length 180 may be between 100 and 150 millimeters (e.g., 120 millimeters), and the height 181 may be between 5 and 20 millimeters (e.g., 10 millimeters). A microscope 182 may extend over the transmission medium 116, and the z-height of the microscope 182 may be adjustable, as indicated by the arrow 183.

Figure 14:
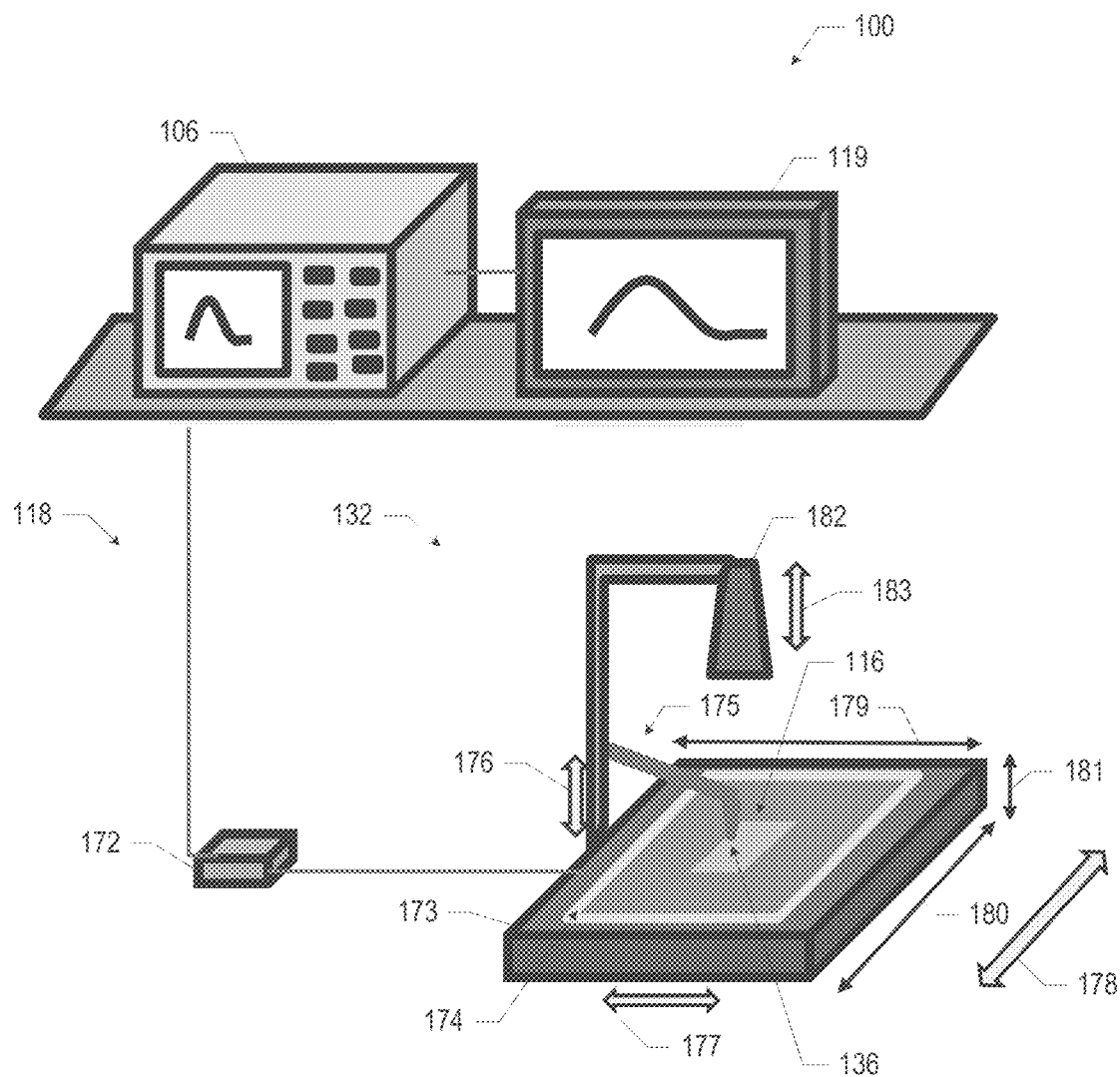
FIG. 14 is a diagram of an example of a manual probe station for TDR that may be included in a transmission medium characterization system, in accordance with various embodiments.

FIG. 14 is a diagram of a system 102 that includes an example of a manual TDR probe station 134, in accordance with various embodiments. The waveform generator 106 and the computing device 119 may take the form of any of the embodiments discussed above (e g, with reference to FIG. 2). The interface circuitry 118 of FIG. 14 may include a sample module 172 with circuitry to sample the signals transmuted to/reflected back from the transmission medium 116 (e.g., at any of the sampling frequencies discussed above). A fixture 173 may include an insert plate 174 on which the transmission medium 116 is disposed (e.g., as a device under test, such as an IC package). A coaxial cable 175 may couple the probe 136 to the sample module 172. The z-height of the coaxial cable 175 (and thus the probe 136) may be manually adjustable, as indicated by the arrow 176; in some embodiments, the x- and y-positions of the probe 136 may also be manually adjustable. The position of the insert plate 174 may be manually adjustable in the x-direction (as indicated by the arrow 177) and the y-direction (as indicated by the arrow 178). The fixture 173 may have any suitable shape or dimensions. For example, in some embodiments, the fixture 173 may be rectangular, the width 179 may be between 100 and 150 millimeters (e.g., 120 millimeters), the length 180 may be between 100 and 150 millimeters (e.g., 120 millimeters), and the height 181 may be between 5 and 20 millimeters (e.g., 10 millimeters). A microscope 182 may extend over the transmission medium 116, and the z-height of the microscope 182 may be adjustable, as indicated by the arrow 183.

Figure 15:
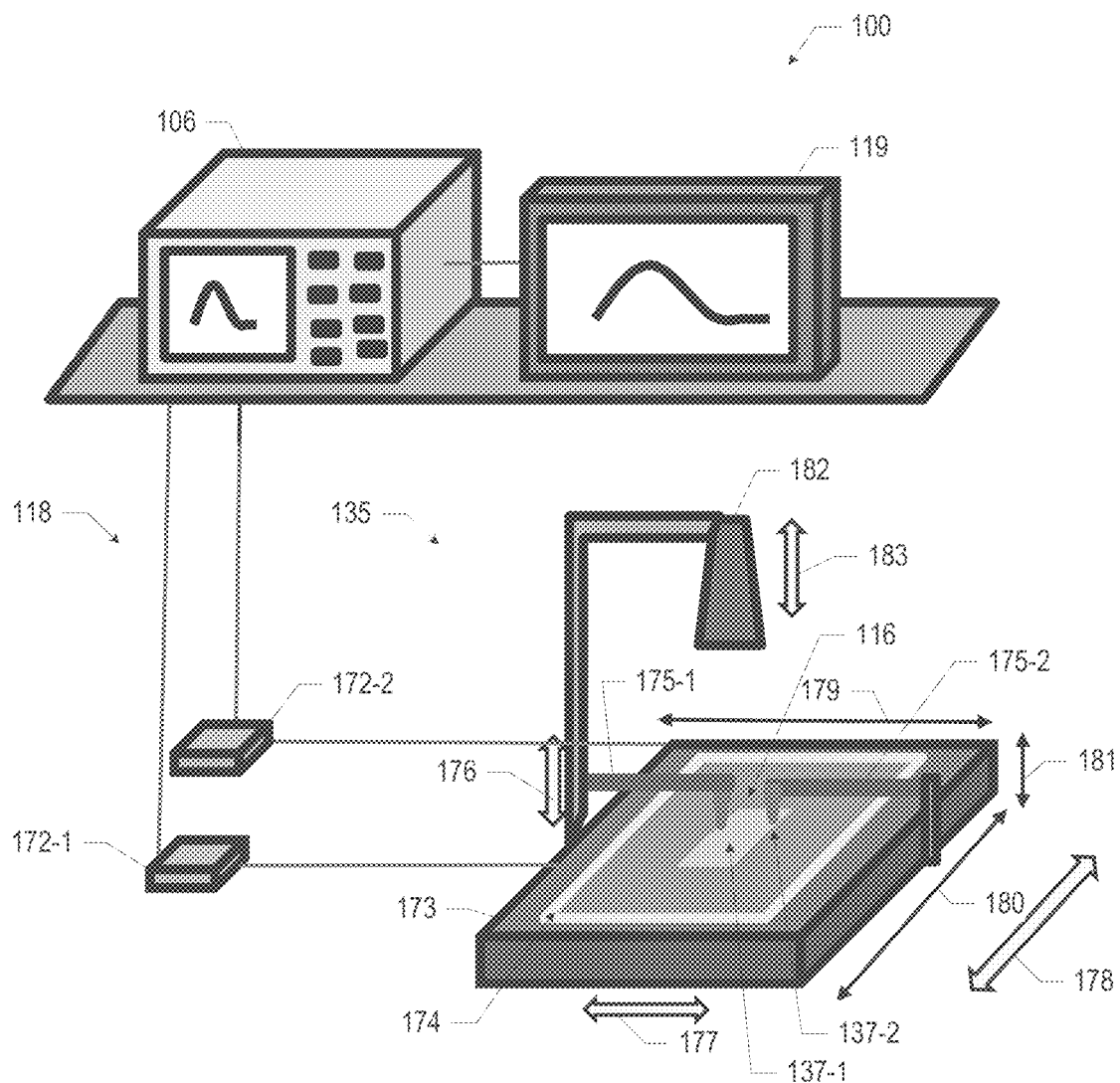
FIG. 15 is a diagram of an example of a fine-pitch probe station for time domain transmissometry that may be included in a transmission medium characterization system, in accordance with various embodiments.

FIG. 15 is a diagram of a system 102 that includes an example of a fine-pitch TDT probe station 135, in accordance with various embodiments. The waveform generator 106 and the computing device 119 may take the form of any of the embodiments discussed above (e.g., with reference to FIG. 2). The interface circuitry 118 of FIG. 15 may include two sample modules 172-1 and 172-2 with circuitry to sample the signals transmitted to and transmitted through the transmission medium 116 (e.g., at any of the sampling frequencies discussed above). A fixture 173 may include an insert plate 174 on which the transmission medium 116 is disposed (e.g., as a device under test, such as an IC package). Coaxial cables 175-1 and 175-2 may couple the probes 1371-1 and 137-2 to the sample modules 172-1 and 172-2, respectively. The z-height of the coaxial cables 175 (and thus the probes 137) may be adjustable, as indicated by the arrow 176. The position of the insert plate 174 may be adjustable in the x-direction (as indicated by the arrow 177) and the y-direction (as indicated by the arrow 178). The fixture 173 may have any suitable shape or dimensions. For example, in some embodiments, the fixture 173 may be rectangular, the width 179 may be between 100 and 150 millimeters (e.g., 120 millimeters), the length 180 may be between 100 and 150 millimeters (e.g., 120 millimeters), and the height 181 may be between 5 and 20 millimeters (e.g., 10 millimeters). A microscope 182 may extend over the transmission medium 116, and the z-height of the microscope 182 may be adjustable, as indicated by the arrow 183.

The following paragraphs provide examples of various ones of the embodiments disclosed herein.

Example 1 is a system for characterizing a transmission medium, including: a waveform generator to generate an initial input waveform; waveform pre-processing circuitry to filter the initial input waveform to generate a processed input waveform for provision to the transmission medium, wherein the processed input waveform has a maximum amplitude greater than a maximum amplitude of the initial input waveform; and waveform output circuitry to display or store data representative of an initial output waveform, wherein the initial output waveform is output from the transmission medium as a reflection or transmission of the processed input waveform.

Example 2 may include the subject matter of Example 1, and may further specify that the waveform pre-processing circuitry includes a derivative filter.

Example 3 may include the subject matter of Example 2, and may further specify that the initial input waveform is a step function.

Example 4 may include the subject matter of any of Examples 1-3, and may further specify that the waveform pre-processing circuitry includes a high-pass filter.

Example 5 may include the subject matter of Example 4, and may further specify that the high-pass filter is a finite impulse response filter.

Example 6 may include the subject matter of any of Examples 1-4, and may further specify that the waveform output circuitry includes waveform post-processing circuitry to filter the initial output waveform to generate a processed output waveform, and the data representative of the initial output waveform is the processed output waveform.

Example 7 may include the subject matter of Example 6, and may further specify that the waveform post-processing circuitry includes difference circuitry to subtract, from the initial output waveform, a filtered version of the processed input waveform.

Example 8 may include the subject matter of Example 7, and may further specify that the waveform post-processing circuitry includes a low-pass filter, and wherein the processed input waveform is filtered with the low-pass filter as part of generation of the filtered version of the processed input waveform.

Example 9 may include the subject matter of Example 8, and may further specify that the low-pass filter is a first-order filter.

Example 10 may include the subject matter of any of Examples 8-9, and may further specify that a decay time constant of the low-pass filter is equal to a decay time constant of an impulse response of the transmission medium.

Example 11 may include the subject matter of any of Examples 1-10, and may further specify that the initial output waveform is a reflection of the processed input waveform.

Example 12 may include the subject matter of any of Examples 1-11, and may further specify that the transmission medium includes a trace of an embedded multichip interconnect bridge.

Example 13 is a system for characterizing a transmission medium, including: waveform input circuitry to generate an input waveform for provision to the transmission medium;

and waveform output circuitry to display or store data representative of an initial output waveform, wherein the initial output waveform is output from the transmission medium as a reflection or transmission of the input waveform, the waveform output circuitry includes waveform post-processing circuitry to process the initial output waveform to generate a processed output waveform, and the data representative of the initial output waveform is the processed output waveform.

Example 14 may include the subject matter of Example 13, and may further specify that the waveform post-processing circuitry includes difference circuitry to subtract, from the initial output waveform, a filtered version of the input waveform, as part of generation of the processed output waveform.

Example 15 may include the subject matter of Example 14, and may further specify that the waveform post-processing circuitry includes a low-pass filter, and wherein the input waveform is processed with the low-pass filter as part of generation of the filtered version of the input waveform.

Example 16 may include the subject matter of Example 15, and may further specify that the low-pass filter is a first-order filter.

Example 17 may include the subject matter of any of Examples 15-16, and may further specify that a decay time constant of the low-pass filter is equal to a decay tune constant of an impulse response of the transmission medium.

Example 18 may include the subject matter of any of Examples 14-17, and may further specify that the waveform post-processing circuitry includes delay circuitry, and wherein the input waveform is processed with the delay circuitry as part of generation of the filtered version of the input waveform.

Example 19 may include the subject matter of Example 18, and may further specify that the delay circuitry is to delay the input waveform by an amount of time equal to the transmission or reflection time of the input waveform through the transmission medium.

Example 20 is a method for characterizing a transmission medium, including: generating an input waveform for provision to the transmission medium; receiving an initial output waveform, wherein the initial output waveform is output from the transmission medium as a reflection or transmission of the input waveform; and filtering the initial output waveform to enhance a peak of the initial output waveform.

Example 21 may include the subject matter of Example 20, and may further specify that generating the input waveform for provision to the transmission medium includes generating an initial input waveform and high-pass filtering the initial input waveform as part of generation of the input waveform.

Example 22 may include the subject matter of Example 21, and may further specify that high-pass filtering the initial input waveform includes applying a finite impulse response filter to the initial input waveform.

Example 23 may include the subject matter of any of Examples 21-22, and may further specify that high-pass filtering the initial input waveform includes applying a derivative filter.

Example 24 may include the subject matter of any of Examples 21-23, and may further specify that the initial input waveform is a step function.

Example 25 may include the subject matter of any of Examples 21-24, and may further include displaying the initial input waveform and the input waveform simultaneously.

Example 26 may include the subject matter of any of Examples 20-25, and may further specify that filtering the initial output waveform to enhance the peak of the initial output waveform includes subtracting a filtered version of the input waveform from the initial output waveform.

Example 27 may include the subject matter of Example 26, and may further specify that filtering the initial output waveform to enhance the peak of the initial output waveform includes low-pass filtering the input waveform as part of generation of the filtered version of the input waveform.

Example 28 may include the subject matter of Example 27, and may further specify that a decay time constant of the low pass filter is equal to a decay time constant of an impulse response of the transmission medium.

Example 29 may include the subject matter of any of Examples 26-28, and may further specify that filtering the initial output waveform to enhance the peak of the initial output waveform includes delaying the input waveform as part of generation of the filtered version of the input waveform.

Example 30 may include the subject matter of Example 29, and may further specify that delaying the input waveform includes delaying the input waveform by an amount of time equal to the transmission or reflection time of the input waveform through the transmission medium.

Example 31 may include the subject matter of any of Examples 20-30, and may further include displaying the filtered initial output waveform.

Example 32 is a method for characterizing a transmission medium, including: generating an initial input waveform, generating a processed input waveform, for provision to the transmission medium, by processing the initial input waveform, wherein the processed input waveform has a maximum amplitude greater than a maximum amplitude of the initial input waveform; and receiving an output waveform, wherein the output waveform is output from the transmission medium as a reflection or transmission of the input waveform.

Example 33 may include the subject matter of Example 32, and may further specify that filtering the initial input waveform includes high pass filtering the initial input waveform.

Example 34 may include the subject matter of Example 33, and may further specify that high-pass filtering the initial input waveform includes applying a finite impulse response filter to the initial input waveform.

Example 35 may include the subject matter of any of Examples 33-34, and may further specify that high-pass filtering the initial input waveform includes applying a derivative filter.

Example 36 may include the subject matter of any of Examples 33-35, and may further specify that the initial input waveform is a step function.

Example 37 may include the subject matter of any of Examples 32-36, and may further include displaying the initial input waveform and the processed input waveform simultaneously.

Example 38 is one or more computer readable media (e.g., non-transitory computer readable media) having instructions thereon that, in response to execution by one or more processing devices of a computing device, cause the computing device to perform the method of any of Examples 20-37.

The invention claimed is:

1. A system for characterizing a transmission medium, comprising:
   a waveform generator to generate an initial input waveform;
   waveform pre-processing circuitry to filter the initial input waveform to generate a processed input waveform for provision to the transmission medium, wherein the processed input waveform has a maximum amplitude greater than a maximum amplitude of the initial input waveform; and
   waveform output circuitry to display or store data representative of an initial output waveform, wherein the initial output waveform is output from the transmission medium as a reflection or transmission of the processed input waveform.

2. The system of claim 1, wherein the waveform pre-processing circuitry includes a derivative filter.

3. The system of claim 2, wherein the initial input waveform is a step function.

4. The system of claim 1, wherein the waveform pre-processing circuitry includes a high-pass filter.

5. The system of claim 4, wherein the high-pass filter is a finite impulse response filter.

6. The system of claim 1, wherein the waveform output circuitry includes waveform post-processing circuitry to filter the initial output waveform to generate a processed output waveform, and the data representative of the initial output waveform is the processed output waveform.

7. The system of claim 6, wherein the waveform post-processing circuitry includes difference circuitry to subtract, from the initial output waveform, a filtered version of the processed input waveform.

8. The system of claim 7, wherein the waveform post-processing circuitry includes a low-pass filter, and wherein the processed input waveform is filtered with the low-pass filter as part of generation of the filtered version of the processed input waveform.

9. The system of claim 8, wherein a decay time constant of the low-pass filter is equal to a decay time constant of an impulse response of the transmission medium.

10. The system of claim 1, wherein the initial output waveform is a reflection of the processed input waveform.

11. The system of claim 1, wherein the transmission medium includes a trace of an embedded multichip interconnect bridge.

12. A system for characterizing a transmission medium, comprising:
    waveform input circuitry to generate an input waveform for provision to the transmission medium; and
    waveform output circuitry to display or store data representative of an initial output waveform, wherein the initial output waveform is output from the transmission medium as a reflection or transmission of the input waveform, the waveform output circuitry includes waveform post-processing circuitry to process the initial output waveform to generate a processed output waveform, and the data representative of the initial output waveform is the processed output waveform.

13. The system of claim 12, wherein the waveform post-processing circuitry includes difference circuitry to subtract, from the initial output waveform, a filtered version of the input waveform, as part of generation of the processed output waveform.

14. The system of claim 13, wherein the waveform post-processing circuitry includes a low-pass filter, and wherein the input waveform is processed with the low-pass filter as part of generation of the filtered version of the input waveform.

15. The system of claim 13, wherein the waveform post-processing circuitry includes delay circuitry, and wherein the input waveform is processed with the delay circuitry as part of generation of the filtered version of the input waveform.

16. A method for characterizing a transmission medium, comprising:
    generating an input waveform for provision to the transmission medium;
    receiving an initial output waveform, wherein the initial output waveform is output from the transmission medium as a reflection or transmission of the input waveform; and
    filtering the initial output waveform to enhance a peak of the initial output waveform.

17. The method of claim 16, wherein filtering the initial output waveform to enhance the peak of the initial output waveform comprises subtracting a filtered version of the input waveform from the initial output waveform.

18. The method of claim 17, wherein filtering the initial output waveform to enhance the peak of the initial output waveform comprises low-pass filtering the input waveform as part of generation of the filtered version of the input waveform.

19. The method of claim 18, wherein a decay time constant of the low-pass filter is equal to a decay time constant of an impulse response of the transmission medium.

20. The method of claim 17, wherein filtering the initial output waveform to enhance the peak of the initial output waveform comprises delaying the input waveform as part of generation of the filtered version of the input waveform.

21. The method of claim 16, further comprising:
    displaying the filtered initial output waveform.

22. A method for characterizing a transmission medium, comprising:
    generating an initial input waveform;
    generating a processed input waveform, for provision to the transmission medium, by processing the initial input waveform, wherein the processed input waveform has a maximum amplitude greater than a maximum amplitude of the initial input waveform; and
    receiving an output waveform, wherein the output waveform is output from the transmission medium as a reflection or transmission of the processed input waveform.

23. The method of claim 22, wherein filtering the initial input waveform comprises high-pass filtering the initial input waveform.

24. The method of claim 23, wherein high-pass filtering the initial input waveform comprises applying a finite impulse response filter to the initial input waveform.

25. The method of claim 23, wherein high-pass filtering the initial input waveform comprises applying a derivative filter.

* * * * *